(12) United States Patent
Chiang (10) Patent No.: US 7,184,901 B1
(45) Date of Patent: Feb. 27, 2007

(54) DIGITIZING ELECTRICAL MEASUREMENT SYSTEM

(76) Inventor: Chin Ming Chiang, 5F., No. 4, Lane 123, Sinlai Rd., Sinjhuang City, Taipei County 242 (TW)

( * ) Notice: Subject to any disclaimer, the term of this patent is extended or adjusted under 35 U.S.C. 154(b) by 0 days.

(21) Appl. No.: 11/207,014

(22) Filed: Aug. 18, 2005

(51) Int. Cl.
  *G01R 15/00* (2006.01)
  *G06F 19/00* (2006.01)
(52) U.S. Cl. .................................................. 702/57
(58) Field of Classification Search ............... 702/57, 702/65
  See application file for complete search history.

(56) References Cited

U.S. PATENT DOCUMENTS 4,404,636 A * 9/1983 Campbell et al. ............. 702/65
6,703,843 B2 * 3/2004 Slates ........................ 324/608
2003/0206021 A1 * 11/2003 Laletin et al. ............... 324/426

* cited by examiner

*Primary Examiner*—Michael Nghiem
(74) *Attorney, Agent, or Firm*—The Maxham Firm (57) ABSTRACT

A scheme, including a microcomputer, for measuring physical quantities of a passive component. A programmable sinusoidal signal generator is used for generating the test analog sinusoidal signal. An analog-to-digital conversion system has a first node coupled to the first node of a serial three terminals network, a second node coupled to a second node of a voltage follower or buffer, and a third node coupled to the microcomputer for delivering a second and a third digital sinusoidal signal to determine a physical quantity of a DUT (device under test) by the microcomputer based on the second, third digital sinusoidal signal and the resistance of the reference resistor.

14 Claims, 9 Drawing Sheets

DIGITIZING ELECTRICAL MEASUREMENT SYSTEM

FIELD OF THE INVENTION

The present invention relates to a scheme for measuring the physical quantities, such as resistance, inductance or capacitance of a passive component, and specifically, to a digitizing electrical measurement scheme by using a digital signal processor (DSP).

BACKGROUND OF THE INVENTION

In general, all of the physical parameters of a passive component are not scalar, for example capacitor accompanying with a serial resistance and leakage resistance, inductor accompanying with a serial resistance and capacitance, and resistor accompanying with a capacitance and inductance. In general condition, each of the physical parameter of the passive component also includes another two physical parameters. Conventionally, an AC bridge is used to measure a passive component. For balancing the bridge to acquire an accurately measurement result, it needs to adjust that voltage of applying to the bridge and standard devices on the bridge. Such measuring method by using the AC bridge results in higher cost and more complicated circuits.

In view of above-mentioned drawbacks, the present provides a simple, reliable, lower cost, without adjusting and accurate measuring scheme.

SUMMARY OF THE INVENTION

The present invention provides a digitizing electrical measurement scheme, acting as a LCR meter, by using a digital signal processor (DSP) for measuring the physical quantities, such as resistance, inductance or capacitance of a passive component.

The above-mentioned scheme for measuring physical quantities of a passive component comprises a microcomputer. A programmable sinusoidal signal generator is used for generating analog sinusoidal test signal. A serial three terminals network comprises of a first reference resistor and a two open terminals which connected to a DUT (device under test), wherein the serial three terminals network has a first node connected to the programmable sinusoidal signal generator, a second node connected to a first node of a voltage follower or buffer and a third node connected to signal ground. An analog-to-digital conversion has a first node connected to the first node of the serial three terminals network, a second node connected to a second node of the voltage follower or buffer, and a third node coupled to the microcomputer for delivering a first and a second digital sinusoidal signal to determine a physical quantity of the DUT (device under test) by the microcomputer based on the first, second digital sinusoidal signal and the resistance of the first reference resistor.

The scheme further comprises a plurality of parallel second reference resistors allowing for connecting said DUT (device under test) by followed corresponding analog switches.

The scheme for measuring physical quantities of a passive component comprises a digital signal processor for generating a first digital sinusoidal signal forming a digital data stream over a plurality of sampling cycles. A digital-to-analog converter is coupled to the digital signal processor for transforming the first digital sinusoidal signal into an analog sinusoidal signal. This sinusoidal signal acts as the test signal source. A serial three terminals network has a reference resistor allowing for connecting a DUT (device under test), wherein the serial three terminals network has a first node connected to the digital-to-analog converter. A voltage follower or buffer has a first terminal connected to a second node of the serial three terminals network. A first switch has a first terminal connected to a second terminal of the voltage follower or buffer. A second switch has a first terminal connected to the first node of the serial three terminals network. An analog-to-digital converter has a first node connected to a second node of the first switch and the second switch, and a second node coupled to the digital signal processor for transforming the analog sinusoidal signals into a second and third digital sinusoidal signal to determine a physical quantity of the DUT (device under test) by the digital signal processor based on the second and third digital sinusoidal signal and the resistance of the reference resistor.

The scheme further comprises an active low pass filter having a first terminal coupled to the digital-to-analog converter and a second terminal connected to the first terminal of the serial three terminals network.

In other aspects, the scheme for measuring physical quantities of a passive component comprises a digital signal processor for generating a first digital sinusoidal signal forming a digital data stream over a plurality of sampling cycles. A digital-to-analog converter is coupled to the digital signal processor for transforming the first digital sinusoidal signal into an analog sinusoidal signal. A serial three terminals network has a plurality of parallel resistors allowing for connecting a DUT(device under test) by followed corresponding switches, wherein the serial three terminals network has a first node connected to the digital-to-analog converter. A voltage follower or buffer has a first terminal connected to a second node of the serial three terminals network. A first switch has a first terminal connected to a second terminal of the voltage follower or buffer. A second switch has a first terminal connected to the first node of the serial three terminals network. An analog-to-digital converter has a first node connected to a second node of the first switch and the second switch, and a second node coupled to the digital signal processor for transforming the analog sinusoidal signals into a second and third digital sinusoidal signal to determine a physical quantity of the DUT (device under test) by the digital signal processor based on the second and third digital sinusoidal signal and the resistance of the reference resistor.

The scheme further comprises a low pass filter having a first terminal coupled to the digital-to-analog converter and a second terminal connected to the first node of the serial three terminals network. The scheme further comprises a programmable gain amplifier having a first terminal coupled to the second terminal of the voltage follower or buffer and a second terminal connected to the first node of the first switch.

In another aspect, the further scheme for measuring physical quantities of a passive component comprises a digital signal processor for generating a first digital sinusoidal signal forming a digital data stream over a plurality of sampling cycles. A digital-to-analog converter is coupled to the digital signal processor for transforming the first digital sinusoidal signal into an analog sinusoidal signal. A serial three terminals network has a reference resistor allowing for connecting a DUT(device under test), wherein the serial three terminals network has a first node connected to the digital-to-analog converter. A voltage follower or buffer has a first terminal connected to a second terminal of the serial three terminals network. A first analog-to-digital converter has a first terminal connected to a second terminal of the voltage follower or buffer, and a second terminal coupled to the digital signal processor for transforming the analog sinusoidal signal into a second digital sinusoidal signal. A second analog-to-digital converter has a first terminal connected to the first terminal of the serial three terminals network, and a second terminal coupled to the digital signal processor for transforming the analog sinusoidal signal into a third digital sinusoidal signal to determine the physical quantities of the passive component by the digital signal processor based on the second and third digital sinusoidal signal and the resistance of the reference resistor.

The scheme further comprises a low pass filter having a first terminal coupled to the digital-to-analog converter and a second terminal connected to the first terminal of the serial three terminals network.

BRIEF DESCRIPTION OF THE DRAWINGS

The above objects, and other features and advantages of the present invention will become more apparent after reading the following detailed description when taken in conjunction with the drawings, in which.

DETAILED DESCRIPTION OF THE PREFERRED EMBODIMENT

Figure 1:
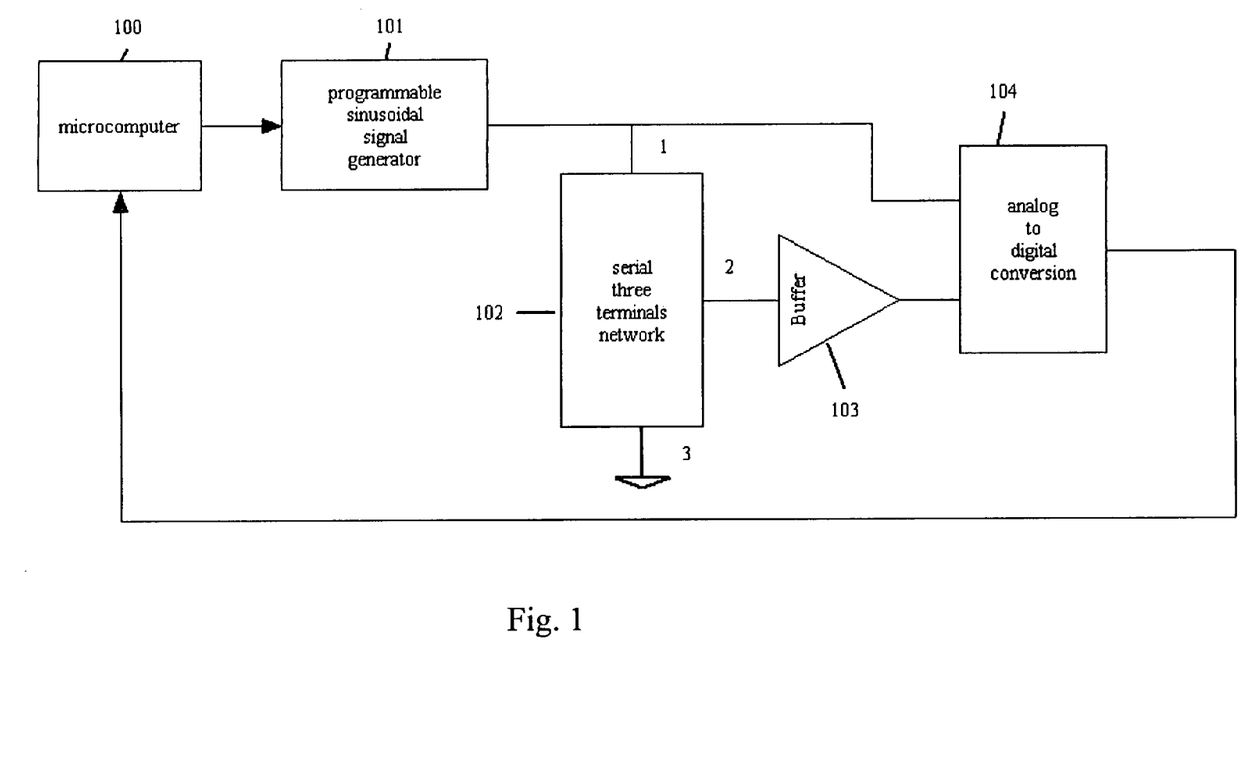
FIG. 1 is a scheme of the digitizing electrical measurement system for measuring the physical quantities of a passive component in accordance with the present invention.

Turning to FIG. 1, a scheme of the present invention is depicted. The scheme includes a microcomputer 100, a programmable sinusoidal signal generator 101, a serial three terminals network 102, a voltage follower or buffer 103, a analog-to-digital conversion 104. In the scheme, the programmable sinusoidal signal generator 101 is used for generating an analog sinusoidal test signal. The first node of the serial three terminals network 102 is connected to the programmable sinusoidal signal generator 101, and a second node of the serial three terminals network 102 connected to a voltage follower or buffer. The serial three terminals network comprises of a first reference resistor and a two open terminals which connected to a DUT (device under test). The first node of the analog-to-digital conversion 104 is connected to the first node of the serial three terminals network 102, a second node of the analog-to-digital conversion 104 connected to a second node of the voltage follower or buffer 103, and a third node of the analog-to-digital conversion 104 coupled to the microcomputer 100 for delivering a second and third digital sinusoidal signal to determine a physical quantity of the DUT (device under test) by the microcomputer 100 based on the second, third digital sinusoidal signal and the resistance of the reference resistor. The DUT (device under test) comprises a passive component.

Figure 2:
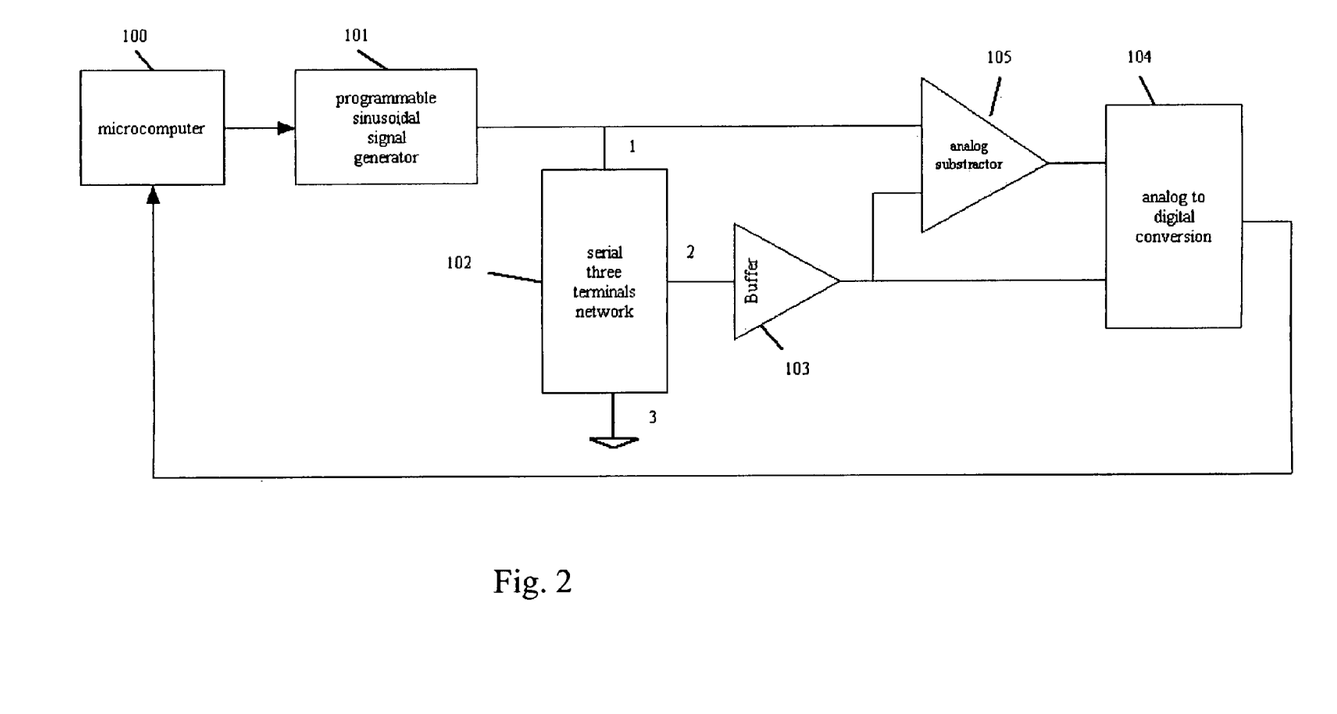
FIG. 2 is a scheme of the digitizing electrical measurement system for measuring the physical quantities of a passive component in accordance with the present invention.
Figure 3:
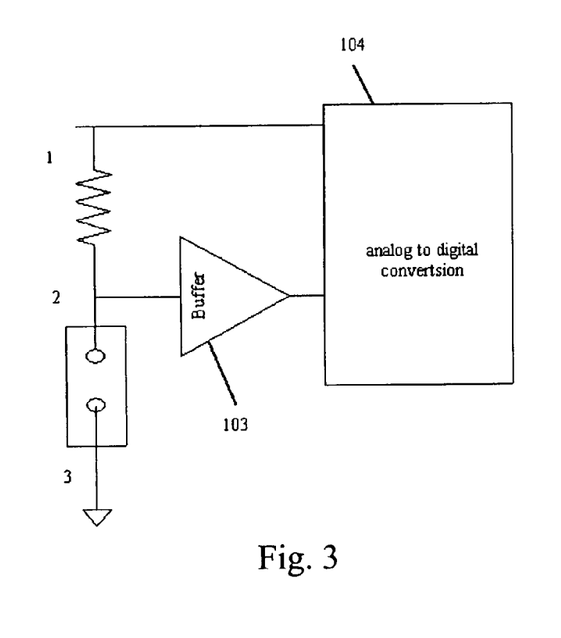
FIG. 3 is a scheme of the first type connection of the serial three terminals network with the analog-to-digital conversion in accordance with the present invention.
Figure 4:
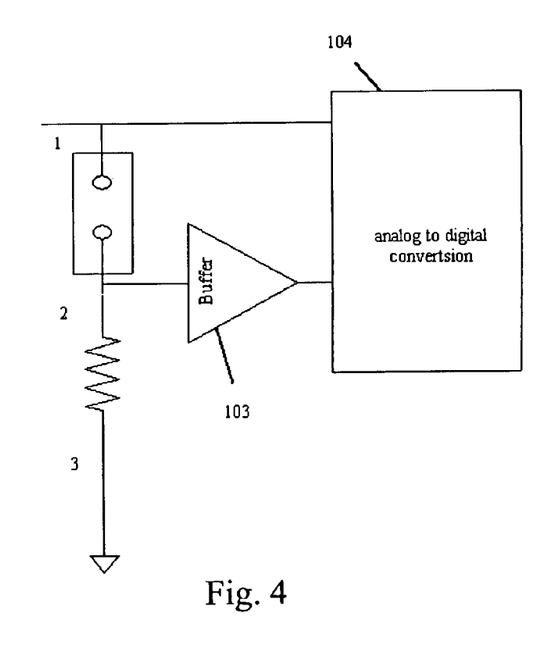
FIG. 4 is a scheme of the second type connection of the serial three terminals network with the analog-to-digital conversion in accordance with the present invention.
Figure 5:
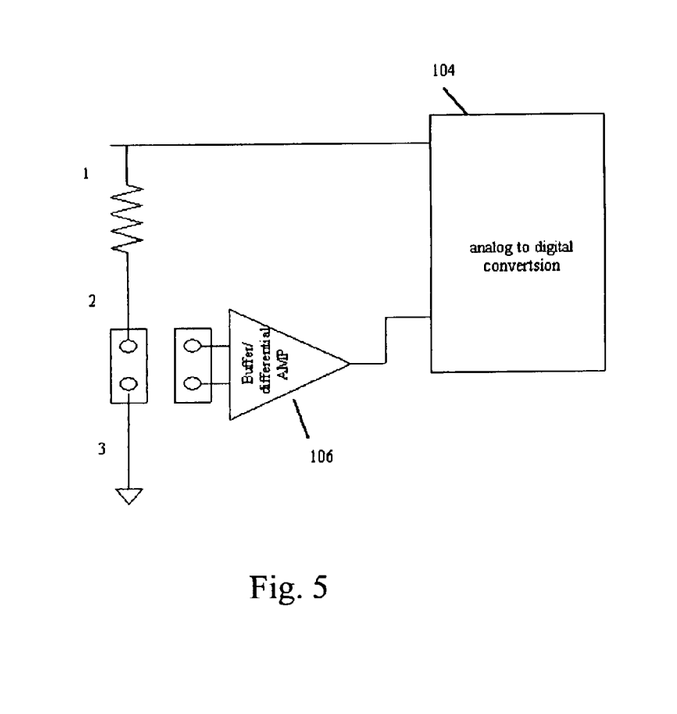
FIG. 5 is a scheme of the third type connection of the serial three terminals network with the analog-to-digital conversion in accordance with the present invention.
Figure 6:
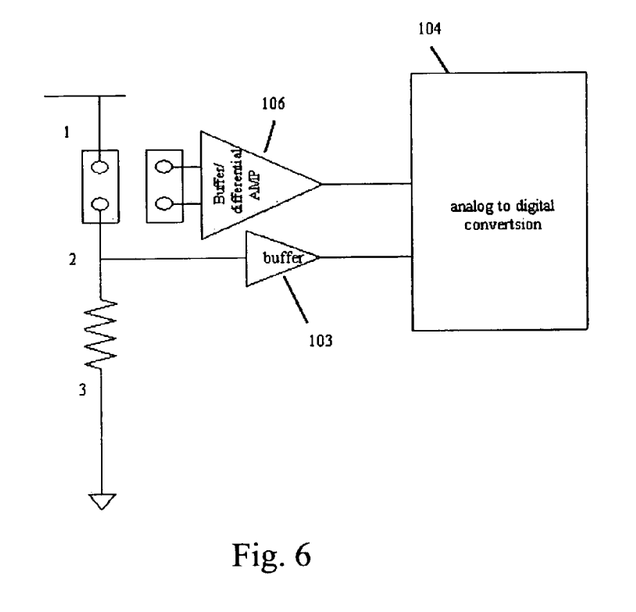
FIG. 6 is a scheme of the fourth type connection of the serial three terminals network with the analog-to-digital conversion in accordance with the present invention.

Moreover, an analog substractor 105 may be added to the system of FIG. 1, wherein the analog substractor 105 has a first node connected to the first node of the serial three terminals network 102, a second node connected to the second node of the voltage follower or buffer 103 and a third node connected to the first node of the analog-to-digital conversion 104, shown as FIG. 2.

FIG. 3~6 are schemes of the various type connection method of the serial three terminals network with the analog-to-digital conversion in accordance with the present invention, wherein the connection status of the reference resistor and the two open terminals may be exchangeable with each other. Moreover, a buffer differential amplifier 106 followed with another two open terminals may be added to connect to the analog-to-digital conversion 104.

Figure 9:
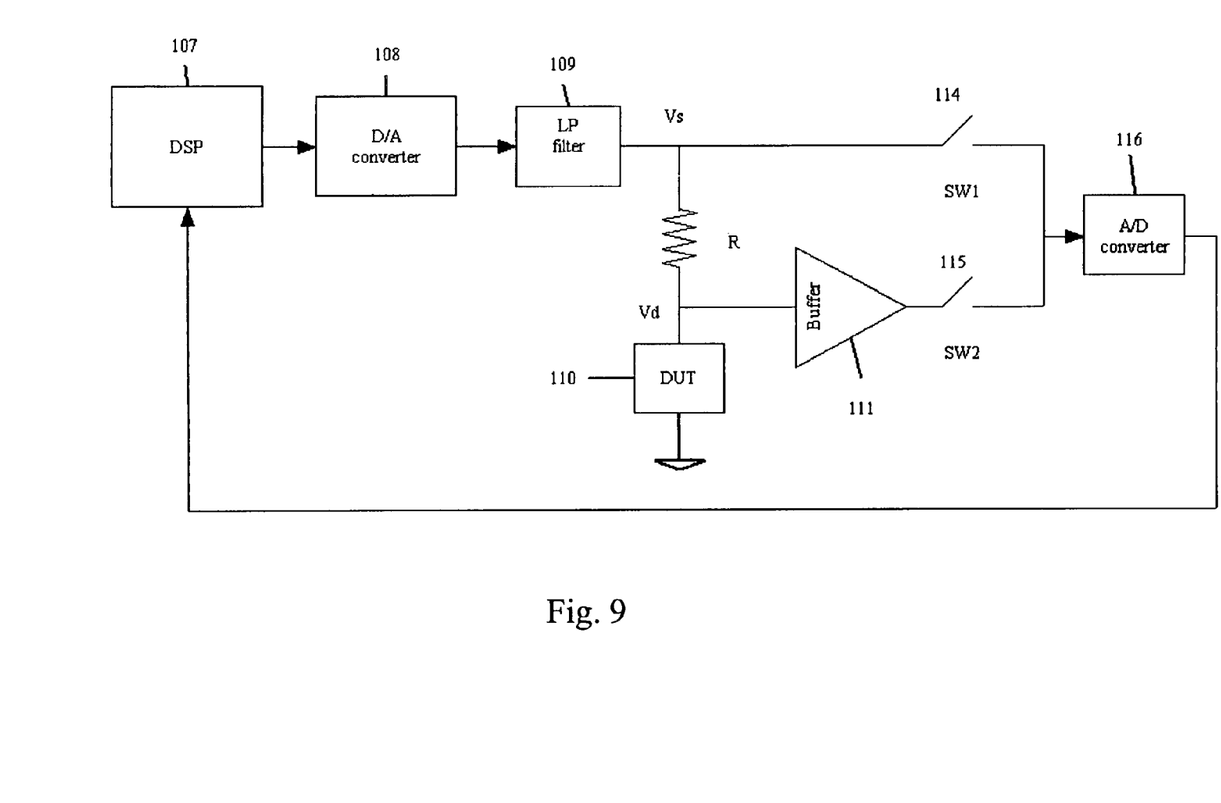
FIG. 9 is a diagram by using two analog switches and one analog-to-digital (A/D) converter in accordance with the present invention.

Turning to FIG. 9, a scheme of the present invention is depicted. The scheme includes a digital signal processor (DSP) 107, a digital-to-analog (D/A) converter 108, a reference resistor R, a voltage follower or buffer 111, a first analog switch 114, a second analog switch 115, analog-to-digital (A/D) converter 116. A low pass filter 109 is optionally. A DUT (device under test) 110 is a un-measured device, such as a passive component 110. In the scheme, the reference resistor and the passive component 110 are serially connected together to constitute a serial three terminals network.

The digital-to-analog (D/A) converter 108 is coupled to the digital signal processor 107 for transforming a first digital sinusoidal signal into an analog sinusoidal signal. The first terminal of the reference resistor connects to the digital-to-analog converter 108. The input terminal of the voltage follower 111 connects to a second terminal of the reference resistor. Moreover, the first terminal of the first analog switch 114 connects to a first terminal of the reference resistor. The first terminal of the second analog switch 115 connects to the output terminal of the voltage follower 111. In addition, the input terminal of the analog-to-digital (A/D) converter 116 connects to a second terminal of the first analog switch 114 and the second analog switch 115. The output terminal of the analog-to-digital (A/D) converter 116 is coupled to the digital signal processor 107 for transforming the analog sinusoidal signals into a second and third digital sinusoidal signal to determine the physical quantities, such as resistance, inductance, Quality factor (Q), Dissipation factor(D) or capacitance of the passive component 104 by the digital signal processor 107 based on the second and third digital sinusoidal signal and the resistance of the reference resistor.

Furthermore, the input terminal of the low pass filter 109 connects to the output terminal of the digital-to-analog converter 108. The output terminal of the low pass filter 109 connects to the first terminal of the reference resistor. The second terminal of the reference resistor is connected to the first terminal of the passive component 110.

Figure 8:
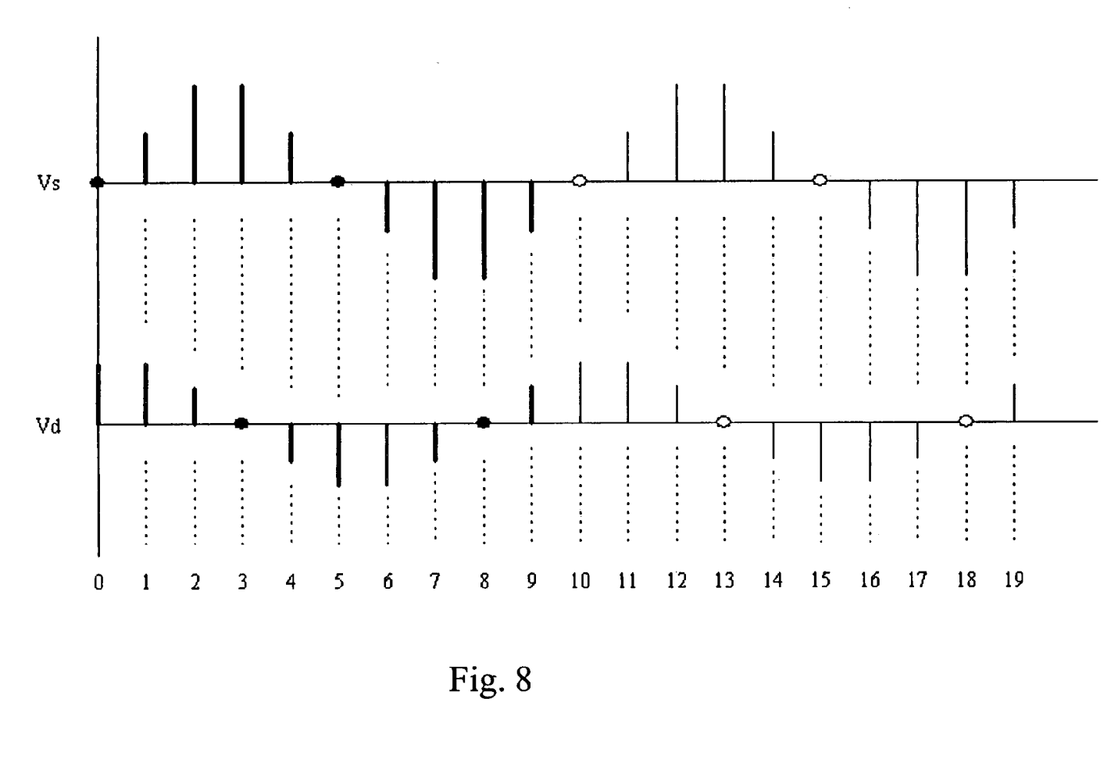
FIG. 8 is an illustration of one entire cycle of sampling points according to the FIG. 7 in accordance with the present invention.
Figure 10:
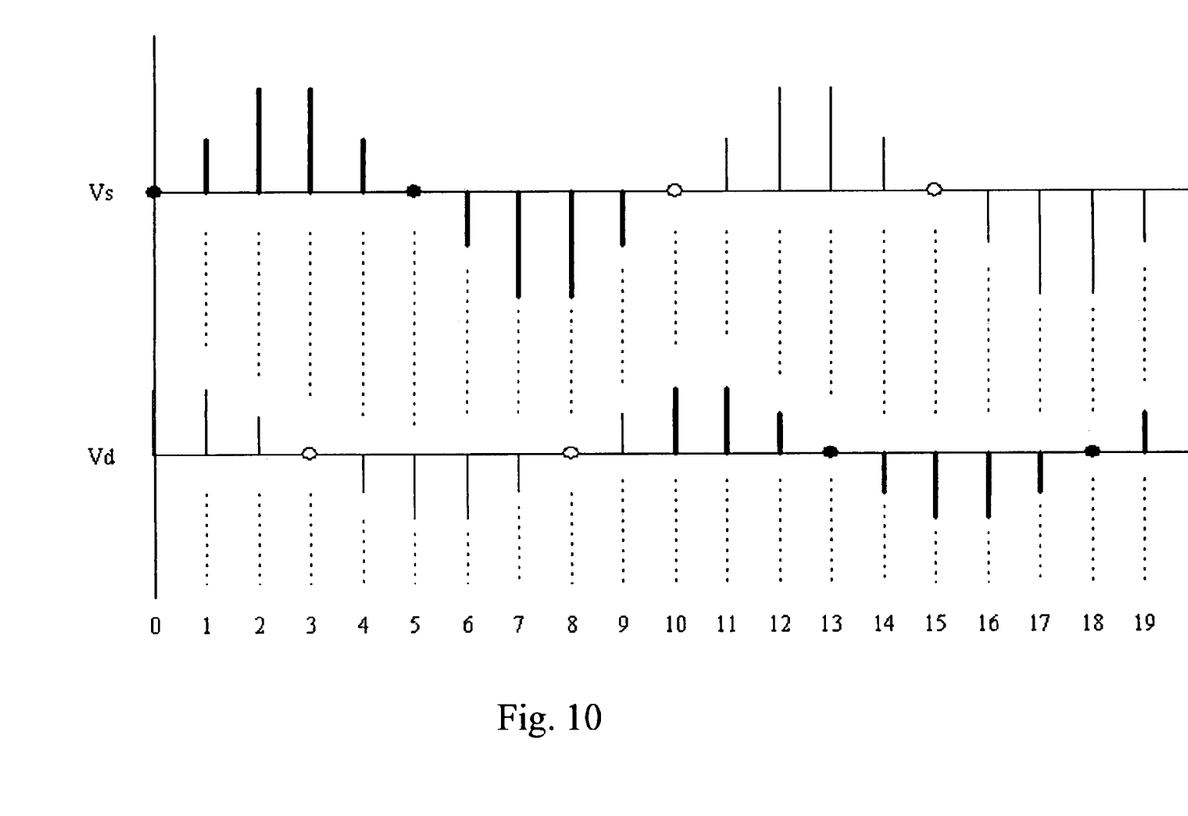
FIG. 10 is an illustration of one entire cycle of sampling points according to the FIG. 9 in accordance with the present invention.

The digital signal processor 107 generates a digital sinusoidal signal by a program. The digital signal forms a digital data stream over a plurality of sampling cycles. The digital sinusoidal signal is transformed into an electrical (analog) sinusoidal signal by the digital-to-analog (D/A) converter 108, thereby obtaining a voltage Vs and a serial current Is throughout the resistor R and the passive component 110. The serial current Is flows through the resistor R and the passive component 110. The voltage drop is Vd on the passive component 110, and Vs–Vd on both terminal of the reference resistor, respectively. The impedance of the passive component 110, Z, is equal to Vd/Is =(Vd*R)/(Vs–Vd). The Vs and Vd need to be determined by a sampling time separated method through two analog switches and one analog-to-digital(A/D)converter or two analog-to-digital(A/D) converters sampling simultaneously, shown as FIG. 8, FIG. 10, respectively.

Figure 7:
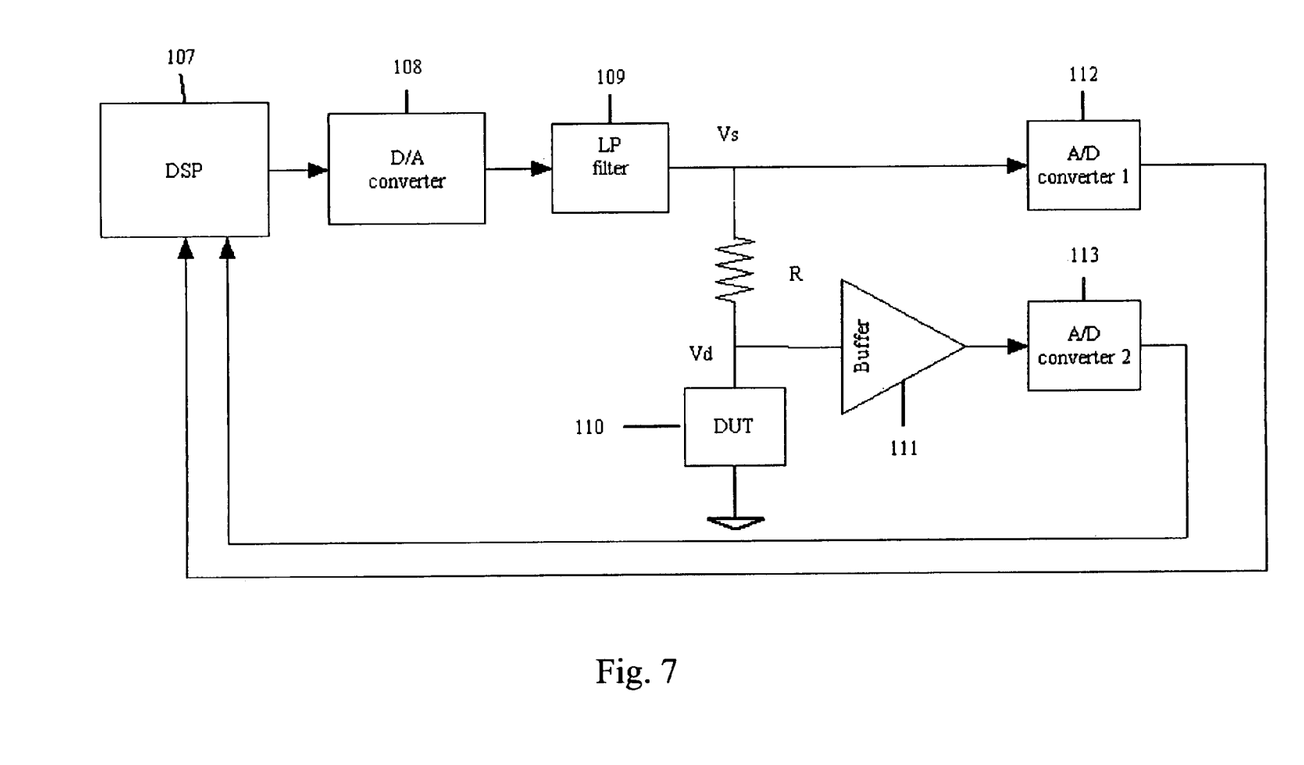
FIG. 7 is a diagram by using two analog-to-digital (A/D) converter in accordance with the present invention.

Turning to FIG. 7, a scheme of the present invention is depicted. The scheme includes a digital signal processor (DSP) 107, a digital-to-analog (D/A) converter 108, a reference resistor, a voltage follower or buffer 111, two analog-to-digital (A/D) converters 112,113. A low pass filter 109 is provided. A DUT (device under test) 110 is a un-measured device, such as a passive component 110. In the scheme, the reference resistor and the passive component 110 are serially connected together to constitute a serial three terminals network. Referring to FIG. 7, using two analog-to-digital (A/D) converters 112,113, for example by 10 points sampling rate per cycle, shown as FIG. 8. Vs and Vd are sampled for one entire sinusoidal cycle, and notice amplitude and phase is different between Vs and Vd.

Similarly, in the FIG. 9, using two switches 114,115 and one analog-to-digital (A/D) converter 116, firstly, the switch (sw1) 114 is turn on and the switch (sw2) 115 is turn off, thereby the analog-to-digital(A/D) converter 116 sampling Vs signal, for example by 10 points sampling rate per cycle, indicated by boldface (sampling points 0~9). After finished one entire sinusoidal cycle, the switch (sw1) 114 is turn off and the switch (sw2) 115 is turn on, thereby the analog-to-digital (A/D) converter 116 sampling Vd signal, indicated by boldface (sampling points 10~19). This sampling time is double of the one mentioned in the aforesaid method, therefore the measuring time is extended. Moreover, according to the two aforementioned sampling methods, the related phase and amplitude of Vs and Vd are the same by both sampling method.

One measurement cycle (to calculate capacitance, inductance, resistance) usually needs sampling several sinusoidal cycle for Vs and Vd. If one A/D converter is used, the states of analog switch S1 and S2 swapped must be done at the exactly time of the completion of the entire sinusoidal cycle been sampled.

As above-mentioned, the impedance of the passive component 110, Z, needs to be determined by the Vs and Vd. The amplitude and the related phase of the Vs and Vd may be determined by the following descriptions. Firstly, two signal tables should be established one sine wave table (S0,S1,S2, S3 . . . ), one cosine wave table (C0,C1,C2,C3 . . . ) with the same sampling points/cycle as Vs signal generated, respectively. For example, by 10 points sampling rate per cycle, sine wave table (S0,S1,S2,S3 . . . S9) and cosine wave table (C0,C1,C2,C3 . . . C9) should be established on memory, if Vs is sampled 500 points (50 cycles) followed by Vs0,Vs1, Vs2,Vs3 . . . Vs499 and Vd is sampled 500 points (50 cycles) followed by Vd0,Vd1,Vd2,Vd3 . . . Vd499. Typically, the sampling rate and sampling points may be selected by demanding. The imagine part and real part of the Vs and Vd vector are followed by the following equations:

$$Vs\_imagine = Vs0 \times S0 + Vs1 \times S1 + Vs2 \times S2 + Vs3 \times S3 + Vs4 \times S4 + \ldots Vs9 \times S9 + Vs10 \times S0 + Vs11 \times S1 + \ldots Vs499 \times S9$$

$$Vs\_real = Vs0 \times C0 + Vs1 \times C1 + \ldots Vs9 \times C9 + Vs10 \times C0 + \ldots Vs499 \times C9$$

$$Vd\_imagine = Vd0 \times S0 + Vd1 \times S1 + Vd2 \times S2 + Vd3 \times S3 + Vd4 \times S4 + \ldots Vd9 \times S9 + Vd10 \times S0 + Vd11 \times S1 + \ldots Vd499 \times S9$$

$$Vd\_real = Vd0 \times C0 + Vd1 \times C1 + \ldots Vd9 \times C9 + Vd10 \times C0 + \ldots Vd499 \times C9$$

As the above-mentioned, the voltage drop between two terminals of the reference resistor R is therefore acquired by equation:

$$Vs - Vd = (Vs\_real - Vd\_real) + j(Vs\_imagine - Vd\_imagine)$$
$$= Vi\_real + jVi\_imagine$$

Next, phase ($\ominus i$) of the current (I) through the passive component 104 is determined by the equation:

$$\ominus i = \tan^{-1}(Vi\_imagine/Vi\_real)$$

$$I = sqrt(Vi\_imagine^2 + Vi\_real^2)$$

The phase ($\ominus v$) of the voltage drop (Vd) between two terminals of the passive component 104 is acquired by the equation:

$$\ominus v = \tan^{-1}(Vd\_imagine/Vd\_real)$$

$$V = sqrt(Vd\_imagine^2 + Vd\_real^2)$$

Moreover, the angle($\ominus$)of the impedance(Z)between two terminals of the passive component 104 is acquired by the equation:

$$\theta = \theta v - \theta i$$

$$Z = res^X(V/I)$$

Accordingly, the serial resistance part(Rs)and reactance part (Xs) of the passive component 110 is therefore acquired by the equations:

$$Rs = \cos \ominus \times Z$$

$$Xs = \sin \ominus \times Z$$

In addition, if the angle, $\ominus$, of the impedance is positive, then Z is inductive reactance (positive reactance), Xl. If the angle, $\ominus$, of the impedance is negative, then Z is capacitive reactance (negative reactance), Xc. The frequency f of the sine wave signal produced by the digital signal processor 100 is known, as the angle, $\ominus$, of the impedance is positive so that $L = Xs/2\pi f$ and Q(Quality factor)$= Xs/Rs$. In the negative angle, $\ominus$, capacitance C and dissipation factor of the passive component 104 is calculated as follows, $C = 1/2\pi f Xs$ and D(Dissipation factor)$= Rs/Xs$.

Furthermore, the amplitude and the related phase of the Vs and Vd may be transformed from time domain into frequency domain data by a FFT (Fast Fourier Transform) or DFT (Discrete Fourier Transform) method. Next, the imagine part and real part of the Vs and Vd vector in frequency domain may be used to determine the physical parameters of the passive component 104 by using the above-mentioned calculating procedure.

Figure 11:
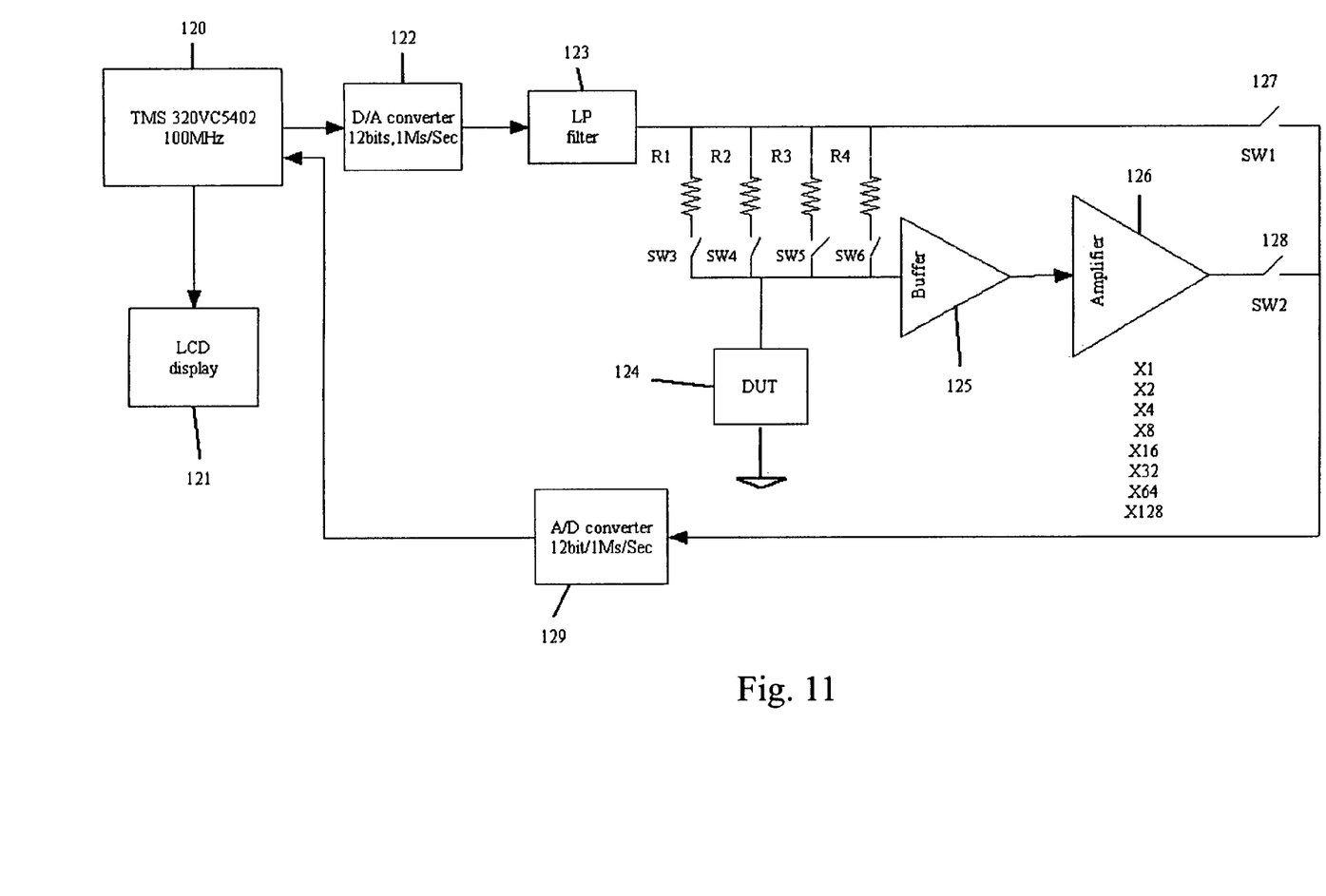
FIG. 11 is a real implemented scheme of the digitizing electrical measurement system for measuring the physical quantities of a passive component in accordance with the present invention.

Referring to FIG. 11, in another embodiment, a scheme of the present invention is real implemented. The scheme includes a digital signal processor (DSP) 120, a digital-to-analog (D/A) converter 122, a plurality of reference resistors R1,R2,R3 and R4, a voltage follower or buffer 125, a first switch 127, a second switch 128, analog-to-digital (A/D) converter 129. A low pass filter 123 is provided. An amplifier 126 may be used to amplify the signal from the buffer 125. A DUT (device under test) 124 is a un-measured device, such as a passive component 124. In the scheme, the reference resistors R1,R2,R3 and R4 are followed corresponding analog switches and connected in parallel. The passive component 124 is serially connected together with the reference resistors R1,R2,R3 and R4 through the switches to constitute a serial measurement circuit.

The digital-to-analog converter 129 is coupled to the digital signal processor 120 for transforming a first sinusoidal digital signal into an analog sinusoidal signal. The first common node of the plurality of resistors R1, R2, R3 and R4 connects to the digital-to-analog converter 129, wherein the resistors R1, R2, R3 and R4 are followed corresponding analog switches and connected in parallel. The resistors R1, R2, R3 or R4 may be selected for various measurement range by the switches such that a serial current Is flows throughout the resistors R1, R2, R3 or R4 and the passive component 124.

The input terminal of the voltage follower 125 connects to a second common node of the switches. The first terminal of the switch (SW2) 128 connects to a second terminal of the voltage follower 125. The first terminal of the analog switch (SW1) 127 connects to the first common node. The input terminal of the analog-to-digital converter 129 connects to a second terminal of the switch 128,127, and the output terminal of the analog-to-digital converter 129 is coupled to the digital signal processor 120 for transforming the analog sinusoidal signals into the second and third digital sinusoidal signal to determine the physical quantities, such as resistance, inductance, Quality factor (Q), Dissipation factor (D) or capacitance of the passive component 124 by the digital signal processor 120 based on the second, third digital signal and the resistance of the reference resistor. The output data may be displayed by the LCD display 121.

Moreover, the input terminal of the low pass filter 123 is coupled to the digital-to-analog converter 122 and the output terminal of the low pass filter 123 connects to the first common node. The input terminal of the amplifier 126 is coupled to the output terminal of the voltage follower 125 and the output terminal of the amplifier 126 is connected to the first terminal of the switch 128. The second common node is connected to the passive component 124.

The DSP 120 TMS320VC5402 acts as the processor in this implementation, with crystal clock 100 MHZ, which generates the required sinusoidal test signal, sampling the measured resultant signal, and do all the control action needed. The digital-to-analog (D/A) converter 122 and A/D converter 129 are implemented by 12 bits/1 Ms/sec converters.

The resistors R1, R2, R3 and R4 are 1K, 2K, 8K and 33K. The amplification of the amplifier 126 may be 1, 2, 4, 8, 16, 32, 64 or 128 by selected.

Typically, the sampling rate and sampling points may be selected by demanding. Similarly, the imagine part and real part of the Vs and Vd vector are determined by the above calculating procedure. Therefore, the physical parameters, such as resistance, inductance, Quality factor(Q), Dissipation factor (D) or capacitance of the passive component 124 are acquired.

In this embodiment, the effective resolution of the capacitance and inductance of the passive component 124 can reach 0.1 pF and 0.1 µH. Moreover, adapting to different resistors R1,R2,R3 or R4 and measuring frequency, the measurement range of the capacitance, inductance and resistance of the passive component 124 can reach 200 µF, 200 H and 100K Ohm, respectively. If more reference resistors are added, the measurement range can be wider to fit various applications.

Moreover, in the present invention, the sine wave is generated digitally by a digital signal processor, thereby the measurement accuracy of the passive component may be improved due to highly frequency accuracy and stability of the digital signal processor.

As will be understood by persons skilled in the art, the foregoing preferred embodiment of the present invention is illustrative of the present invention rather than limiting the present invention. Having described the invention in connection with a preferred embodiment, modification will now suggest itself to those skilled in the art. Thus, the invention is not to be limited to this embodiment, but rather the invention is intended to cover various modifications and similar arrangements included within the spirit and scope of the appended claims, the scope of which should be accorded the broadest interpretation so as to encompass all such modifications and similar structures. While the preferred embodiment of the invention has been illustrated and described, it will be appreciated that various changes can be made therein without departing from the spirit and scope of the invention.

What is claimed is:

1. A digitizing electrical measurement system, comprising:
    a microcomputer;
    a programmable sinusoidal signal generator for generating analog sinusoidal test signal;
    a voltage follower or buffer;
    a serial three terminals network comprised of a first reference resistor and a two open terminals which is coupled to a DUT (device under test ), wherein said serial three terminals network has a first node coupled to said programmable sinusoidal signal generator, a second node coupled to a first node of said voltage follower or buffer and a third node coupled to signal ground; and
    an analog-to-digital conversion having a first node coupled to said first node of said serial three terminals network, a second node coupled to a second node of said voltage follower or buffer, and a third node coupled to said microcomputer for delivering a first and a second digital sinusoidal signal to determine a physical quantity of said DUT (device under test) by said microcomputer based on said first, second digital sinusoidal signal and the resistance of said first reference resistor.

2. The system of claim 1, further comprising an analog substractor having a first node coupled to said first node of said serial three terminals network, a second node coupled to said second node of said voltage follower or buffer and a third node coupled to said first node of said analog-to-digital conversion.

3. The system of claim 1, wherein said buffer is a buffer differential amplifier having a first node coupled to another two open terminals and a second node coupled to said analog-to-digital conversion.

4. The system of claim 1, wherein said DUT (device under test) comprises a passive component.

5. A digitizing electrical measurement system, comprising:
- a digital signal processor for generating a first digital sinusoidal signal, said first digital sinusoidal signal forming a digital data stream over a plurality of sampling cycles;
- a digital-to-analog converter coupled to said digital signal processor for transforming said first digital sinusoidal signal into an analog sinusoidal signal;
- a serial three terminals network having a reference resistor allowing for connecting a DUT (device under test), wherein said serial three terminals network has a first node coupled to said digital-to-analog converter;
- a voltage follower or buffer having a first node coupled to a second node of said serial three terminals network;
- a first switch having a first node coupled to a second node of said voltage follower or buffer;
- a second switch having a first node coupled to said first node of said serial three terminals network; and
- an analog-to-digital converter having a first node coupled to a second node of said first switch and said second switch, and a second node coupled to said digital signal processor for transforming said analog sinusoidal signal into a second and third digital sinusoidal signal to determine a physical quantity of said DUT (device under test) by said digital signal processor based on said second and third digital sinusoidal signal and the resistance of said reference resistor.

6. The system of claim 5, further comprising a low pass filter having a first node coupled to said digital-to-analog converter, a second node coupled to said first node of said serial three terminals network.

7. The system of claim 5, wherein said DUT (device under test) comprises a passive component.

8. A digitizing electrical measurement system, comprising:
- a digital signal processor for generating a first digital sinusoidal signal, said first digital sinusoidal signal forming a digital data stream over a plurality of sampling cycles;
- a digital-to-analog converter coupled to said digital signal processor for transforming said first digital sinusoidal signal into an analog sinusoidal signal;
- a serial three terminals network having a plurality of parallel resistors allowing for connecting a DUT (device under test) by followed corresponding switches, wherein said serial three terminals network has a first node coupled to said digital-to-analog converter;
- a voltage follower or buffer having a first node coupled to a second node of said serial three terminals network;
- a first switch having a first node coupled to a second node of said voltage follower or buffer;
- a second switch having a first node coupled to said first node of said serial three terminals network; and
- an analog-to-digital converter having a first node coupled to a second node of said first switch and said second switch, and a second node coupled to said digital signal processor for transforming said analog sinusoidal signal into a second and third digital sinusoidal signal to determine a physical quantity of said DUT (device under test) by said digital signal processor based on said second and third digital sinusoidal signal and the resistance of said reference resistor.

9. The system of claim 8, further comprising a low pass filter having a first node coupled to said digital-to-analog converter, a second node connected to said first node of said serial three terminals network.

10. The method of claim 9, wherein said advertisement target is set according to a personal profile of said subscriber that is used to target specific advertisements to said subscriber, which includes but not limited to the subscriber's hobby, personal character, style, or interesting.

11. The system of claim 8, wherein said DUT (device under test) comprises a passive component.

12. A digitizing electrical measurement system, comprising:
- a digital signal processor for generating a first digital sinusoidal signal, said first digital sinusoidal signal forming a digital data stream over a plurality of sampling cycles;
- a digital-to-analog converter coupled to said digital signal processor for transforming said first digital sinusoidal signal into an analog sinusoidal signal;
- a serial three terminals network having a reference resistor allowing for connecting a DUT (device under test), wherein said serial three terminals network has a first node coupled to said digital-to-analog converter;
- a voltage follower or buffer having a first node coupled to a second node of said serial three terminals network;
- a first analog-to-digital converter having a first node coupled to a second node of said voltage follower or buffer, and a second node coupled to said digital signal processor for transforming said analog sinusoidal signal into a second digital sinusoidal signal; and
- a second analog-to-digital converter having a first node coupled to said first node of said serial three terminals network, and a second node coupled to said digital signal processor for transforming said analog sinusoidal signal into a third digital sinusoidal signal to determine a physical quantity of said DUT (device under test) by said digital signal processor based on said second and said third digital sinusoidal signal and the resistance of said reference resistor.

13. The system of claim 12, further comprising a low pass filter having a first node coupled to said digital-to-analog converter and a second node coupled to said first node of said serial three terminals network.

14. The system of claim 12, wherein said DUT (device under test) comprises a passive component.

* * * * *